(12) United States Patent
Xia et al.

(10) Patent No.: US 8,703,591 B2
(45) Date of Patent: *Apr. 22, 2014

(54) METHOD FOR FABRICATING BLACK SILICON BY USING PLASMA IMMERSION ION IMPLANTATION

(75) Inventors: Yang Xia, Beijing (CN); Bangwu Liu, Beijing (CN); Chaobo Li, Beijing (CN); Jie Liu, Beijing (CN); Minggang Wang, Beijing (CN); Yongtao Li, Beijing (CN)

(73) Assignee: The Institute of Microelectronics of Chinese Academy of Sciences, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/699,741

(22) PCT Filed: Jul. 26, 2010

(86) PCT No.: PCT/CN2010/075454
§ 371 (c)(1),
(2), (4) Date: Nov. 25, 2012

(87) PCT Pub. No.: WO2011/147115
PCT Pub. Date: Dec. 1, 2011

(65) Prior Publication Data
US 2013/0072007 A1 Mar. 21, 2013

(30) Foreign Application Priority Data

May 25, 2010 (CN) .......................... 2010 1 0181010
Jul. 23, 2010 (CN) .......................... 2010 1 0235399

(51) Int. Cl.
*H01L 21/26* (2006.01)

(52) U.S. Cl.
USPC .......... 438/513; 438/459; 438/651; 438/702; 438/706; 438/714

(58) Field of Classification Search
None
See application file for complete search history.

(56) References Cited

U.S. PATENT DOCUMENTS

| | | | |
|---|---|---|---|
| 2012/0012967 A1* | 1/2012 | Jiang et al. | 257/449 |
| 2013/0068297 A1* | 3/2013 | Xia et al. | 136/256 |
| 2013/0071965 A1* | 3/2013 | Xia et al. | 438/88 |

FOREIGN PATENT DOCUMENTS

| | | |
|---|---|---|
| CN | 101102909 A | 1/2008 |
| CN | 101734611 A | 6/2010 |

* cited by examiner

Primary Examiner — Kyoung Lee
(74) Attorney, Agent, or Firm — Cheng-Ju Chiang

(57) ABSTRACT

A method for fabricating black silicon by using plasma immersion ion implantation is provided, which includes: putting a silicon wafer into a chamber of a black silicon fabrication apparatus; adjusting processing parameters of the black silicon fabrication apparatus to preset scales; generating plasmas in the chamber of the black silicon fabrication apparatus; implanting reactive ions among the plasmas into the silicon wafer, and forming the black silicon by means of the reaction of the reactive ions and the silicon wafer. The method can form the black silicon which has a strong light absorption property and is sensitive to light, and has advantages of high productivity, low cost and simple production process.

31 Claims, 8 Drawing Sheets

METHOD FOR FABRICATING BLACK SILICON BY USING PLASMA IMMERSION ION IMPLANTATION

CROSS REFERENCE TO RELATED APPLICATIONS

The present application is a 35 U.S.C. §371 National Phase conversion of International (PCT) Patent Application No. PCT/CN2010/075454, filed on Jul. 26, 2010, the disclosure of which is incorporated by reference herein. The PCT International Patent Application was published in Chinese.

TECHNICAL FIELD

The present invention relates to a black silicon fabrication method, in particular to a method for fabricating black silicon by using plasma immersion ion implantation.

BACKGROUND OF THE INVENTION

Black silicon is a revolutionarily new material structure of the electronic industry, usually referring to silicon face or silicon-based film with a high absorptivity. Compared with the structures of common silicon materials, it has a fairly strong light absorption property. If it is applied to optical sensors or solar cells, then their photosensitivity would be 100 times better and therefore the conversion efficiency of solar cells can be improved significantly.

The fabrication of black silicon began with the experiment done by Professor Eric Mazur at Harvard University in 1999, during which he and his graduate students put silicon wafers into a vacuum environment filled up with halogen gas, and then scanned them using an ultra-intense and ultra-short-time laser beam (femtosecond laser). The surfaces of the scanned silicon wafers turned black, but not that caused by scorch. The researchers looked through the electronic microscope and observed that a forest-like peg structure was formed on such wafer surface, which facilitated reduction of ray reflection and improvement of light absorption property.

Later, the Professor Eric Mazur and his team also used a common gas of the semiconductor industry—sulfur hexafluoride ($SF_6$), specifically, they put common silicons into an enclosed space filled up with $SF_6$ and then bombarded them with the strong pulse of a femtosecond laser. After 500 times of pulse scanning, the silicon wafers presented black through naked eye. With the help of electronic microscope, the researchers observed that the wafer surface was an extremely thin peg structure and this procedure roughened the wafer surface. However, fabricating black silicon using femtosecond laser involves complex process, complicated procedural controls, costly equipment and inconvenient maintenance, not facilitating volume production.

The Chinese Patent Specification CN 101734611 A (publication date: Jun. 16, 2010) disclosed a black silicon fabrication method based on maskless deep reactive ion etching, which includes the following steps: let the equipment required for said black silicon fabrication method undergo initialization and plasma stabilization in order to allow for the plasmas' glow discharge; control the process parameters of said black silicon fabrication method based on deep reactive ion etching, and process silicon wafers alternately by etching and passivation; wherein said parameters include plasma gas flow, etching plate power, passivating plate power, coil power and etching, passivation period, and temperature. Although this method for fabricating black silicon is more efficient and cost-effective compared with that using a femtosecond laser, it has some disadvantages such as complex process, complicated procedural controls and low efficiency as it requires silicon wafers to be alternately etched and passivated, that is, repeatedly implanting etching gas and passivation gas and also adjusting corresponding flow, power, time and environmental parameters.

SUMMARY OF THE INVENTION

The technical problem to be solved by the present invention is to provide a method for fabricating black silicon by using plasma immersion ion implantation. The method can form the black silicon on the silicon wafer which has a strong light absorption property and is sensitive to light, and has advantages of high productivity, low cost, simple and convenient process controls.

In order to solve the above-mentioned technical problem, the present invention provides a method for fabricating black silicon by using plasma immersion ion implantation, said method comprises: putting a silicon wafer into a black silicon fabrication apparatus, and using the plasma immersion ion implantation process to fabricate black silicon.

Further, the present invention also has the following characteristics, said method comprises:
(a) putting said silicon wafer into a chamber of said black silicon fabrication apparatus;
(b) adjusting the processing parameters of said black silicon fabrication apparatus to allow them to enter into preset numerical scales;
(c) generating plasmas in the chamber of said black silicon fabrication apparatus, the reactive ions among said plasmas are implanted into said silicon wafer;
(d) forming black silicon by means of the reaction of said reactive ions and said silicon wafer.

Further, the present invention also has the following characteristics: said step (a) further comprises said silicon wafer electrical connected to a power supply capable of applying bias voltage.

Further, the present invention also has the following characteristics: said processing parameters comprise the base pressure and operating pressure implanted into said chamber.

Further, the present invention also has the following characteristics, said step (b) comprises the following steps:
Pumping the gas in said chamber to make the pressure implanted into said chamber enter into a preset base pressure scale, and said preset base pressure scale ranges from $10^{-7}$ Pa to 1000 Pa;
Filling into said chamber with the mixed gas which can react with said silicon wafer, and adjusting the flow of said mixed gas to make the pressure implanted into said chamber enter into a preset operating pressure scale, and said preset operating pressure scale ranges from $10^{-3}$ Pa to 1000 Pa.

Further, the present invention also has the following characteristics, said step (b) comprises the following steps:
Pumping the gas in said chamber to make the pressure implanted into said chamber enter into a preset base pressure scale, and said preset base pressure scale ranges from $10^{-7}$ Pa to 1000 Pa;
Filling into said chamber with the mixed gas which can react with said silicon wafer, and adjusting the speed of pumping the gas in said chamber by said black silicon fabrication apparatus to make the pressure implanted into said chamber enter into a preset operating pressure scale, and said preset operating pressure scale ranges from $10^{-3}$ Pa to 1000 Pa.

Further, the present invention also has the following characteristics: said mixed gas consist of the gas having an etching effect and the gas having a passivation effect.

Further, the present invention also has the following characteristics: said gas having an etching effect includes $SF_6$, $CF_4$, $CHF_3$, $C_4F_8$, $NF_3$, $SiF_4$, $C_2F_6$, HF, $BF_3$, $PF_3$, $Cl_2$, HCl, $SiH_2Cl_2$, $SiCl_4$, $BCl_3$ or HBr, and the gas having a passivation effect includes $O_2$, $N_2O$, or $N_2$.

Further, the present invention also has the following characteristics: said processing parameters further includes the volume ratio between said gas having an etching effect and said gas having a passivation effect.

Further, the present invention also has the following characteristics, said the step (b) further comprises the following step:

Adjusting the volume ratio scale between said gas having an etching effect and said gas having a passivation effect in said mixed gas to allow it to enter into a preset volume ratio scale, and said preset volume ratio scale ranges from 0.01 to 100.

Further, the present invention also has the following characteristics: said processing parameters further include the output power and frequency of the plasma power supply of said black silicon fabrication apparatus as well as the frequency, pulse width and duty ratio of the power supply which can apply a bias voltage, and said bias voltage.

Further, the present invention also has the following characteristics, said step (b) further comprises the following step: Adjusting the output power of said plasma power supply to allow it to enter into a preset output power scale, and said preset output power scale ranges from 1 to 100000 W.

Further, the present invention also has the following characteristics, said step (b) further comprises the following step:

Adjusting said bias voltage to allow it to enter into a preset bias voltage scale, and said preset bias voltage scale ranges from −100000 to 100000V.

Further, the present invention also has the following characteristics, said step (b) further comprises the following step:

Adjusting the frequency of said plasma power supply to allow it to enter into a preset frequency scale of the plasma power supply, and said preset frequency scale of the plasma power supply ranges from DC to 10 GHz.

Further, the present invention also has the following characteristics, said step (b) further comprises the following step:

Adjusting the pulse width of said power supply which can apply a bias voltage to allow it to enter into a preset pulse width scale, and said preset pulse width scale ranges from 1 us to 1 s.

Further, the present invention also has the following characteristics, said step (b) further comprises the following step:

Adjusting the frequency of said power supply which can apply a bias voltage to allow it to enter into a preset frequency scale of the power supply, and said preset frequency scale of the power supply ranges from DC to 10 GHz.

Further, the present invention also has the following characteristics, said step (b) further comprises the following step:

Adjusting the duty ratio of said power supply which can apply a bias voltage to allow it to enter into a preset duty ratio scale, and said preset duty ratio scale ranges from 1% to 99%.

Further, the present invention also has the following characteristics: said bias voltage consist of a variety of bias voltages and combination.

Further, the present invention also has the following characteristics: said method further comprises the pretreatment process of said silicon wafer before fabricating black silicon by using plasma immersion ion implantation, said pretreatment process includes such procedures as cleaning, polishing, doping, annealing, corrosion, etching or visualization.

Further, the present invention also has the following characteristics: said method further comprises the post-treatment process of said black silicon after fabricating black silicon by using plasma immersion ion implantation, said post-treatment process includes such procedures as cleaning, polishing, doping, annealing, corrosion, etching or visualization.

Compared with the existing technologies, the present invention has the following advantages:

A. Because the present invention uses plasma immersion ion implantation to fabricate black silicon, namely, the chamber meeting a certain degree requirement of vacuum is filled up with mixed gas, and under the influence of applied electric field, the generated plasmas are then implanted into and react with silicon wafers, it requires only one-time processing to fabricate black silicon. The method has fairly high efficient productivity, simple and convenient process controls, avoiding the repeated gas filling of the deep etching processing technology and the complicated procedures of the laser scanning processing technology;

B. The method realizes low cost, because the plasma immersion ion implantation apparatus used in the present invention is simple in structure, convenient in maintenance and requires a low degree of vacuum;

C. Silicon wafers with complex shapes can be conveniently processed because all exposed parts of silicon wafers which are immersed in plasmas are implanted at the same time in the plasma immersion ion implantation apparatus used in the present invention; moreover, the fabricated black silicon has a uniform structure, high light absorption property, high current collection rate, good electrical characteristics and long service life.

DETAILED DESCRIPTION OF THE PRESENTLY PREFERRED EMBODIMENTS

In order to understand the present invention deeply, the present invention is described detailed as below in combination with the figures and embodiments.

Plasma Immersion Ion Implantation (PIII for short), also known as plasma implantation, plasma doping, plasma immersion implantation, plasma source ion implantation or plasma base ion implantation in the semiconductor industrial community, is a kind of process technology that can be described this way: the samples to be implanted are directly immersed in the plasmas and then acted upon by the applied bias voltage (also known as "implantation voltage") so that an implantation sheath electrical field is formed between the samples and the plasmas; the reactive ions both in the implantation sheath electrical field and that enter implantation sheath electrical field through the plasmas are directly implanted into the samples under the accelerating action of the electrical field. Due to the sheath formed on the surfaces of samples, the implantation will occur simultaneously everywhere on the surfaces of samples exposed in plasmas.

Compared with the etching technology, fabricating black silicon by using plasma immersion ion implantation is to implant directly reactive ions into samples where reactions occur simultaneously on the samples' surfaces and inside the samples, achieving a higher efficiency and better result and easily generating black silicon with a mesh or cavernous structure. The etching processing technology usually can only generate black silicon with a needle or peg forest structure. The experimental comparison showed that the black silicon with a mesh or cavernous structure has a higher current collection rate and that the solar cells made of such silicon have a better conversion rate and electrical characteristics.

Figure 1:
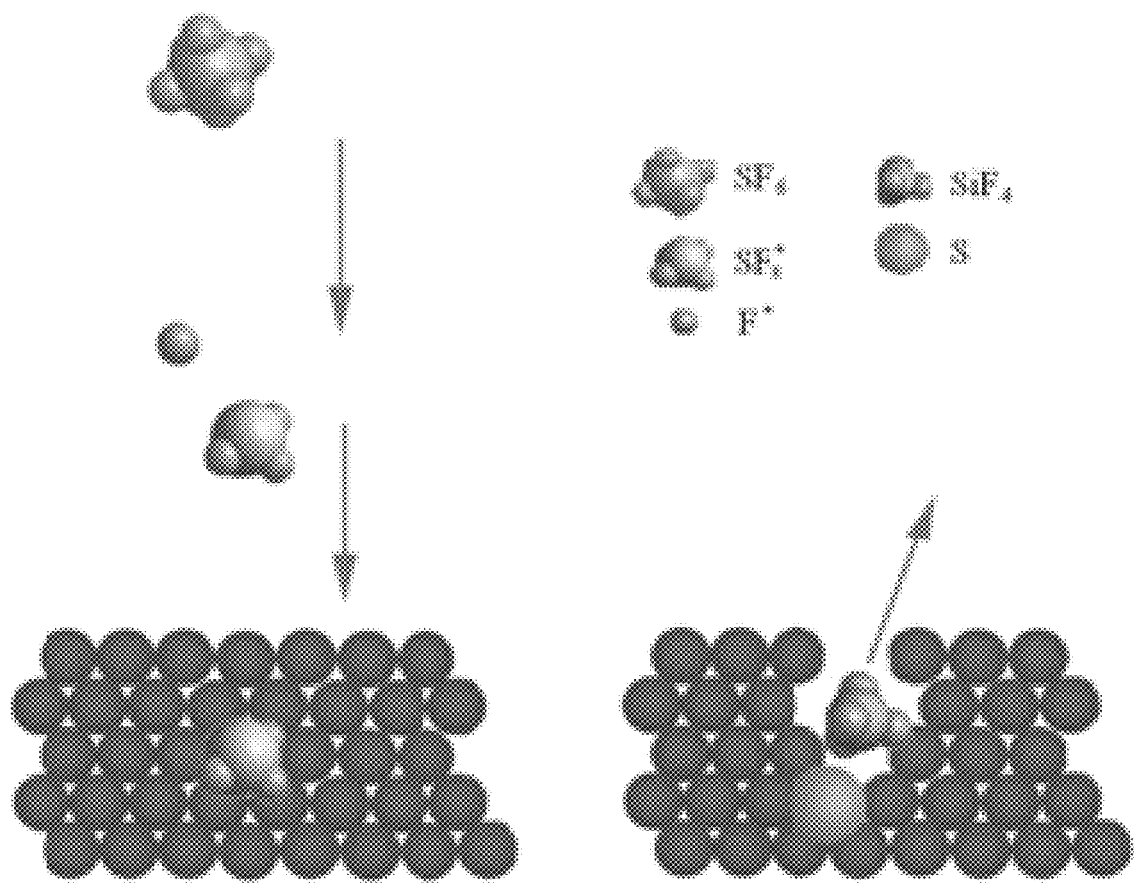
FIG. 1 is a principle schematic diagram of fabricating black silicon by using plasma immersion ion implantation of the present invention.

The principle of black silicon fabrication using plasma immersion ion implantation is as shown in FIG. 1. During the plasma immersion ion implantation, the used mixed gas is composed of two gases, the gas having an etching effect and the gas having a passivation effect, mixed at a certain volume ratio. The gas having an etching effect includes $SF_6$, $CF_4$, $CHF_3$, $C_4F_8$, $NF_3$, $SiF_4$, $C_2F_6$, HF, $BF_3$, $PF_3$, $Cl_2$, HCl, $SiH_2Cl_2$, $SiCl_4$, $BCl_3$ or HBr; the gas having a passivation effect includes $O_2$, $N_2O$ or $N_2$. In FIG. 1, the mixed gas is a combination of $SF_6$ and $O_2$ mixed at a certain volume ratio. Under certain processing conditions, the mixed gas is ionized to produce some groups such as F* group produced by $SF_6$ and O* group by $O_2$. At the moment, the F* group combines with Si to form $SiF_4$ which produces an etching effect on Si; the O* group combines with Si to form $Si_xO_yF_z$ on the etching wall surface which produces a passivation effect on the etching wall. Consequently, black silicon with a porous or mesh structure is formed under both etching and passivation effects.

In the present invention, the method for fabricating black silicon by using plasma immersion ion implantation comprises the following main procedures: putting a silicon wafer into a black silicon fabrication apparatus, and using the plasma immersion ion implantation process to fabricate black silicon.

The black silicon fabrication apparatus, such as plasma immersion ion implanter, usually comprises a chamber and plasma source. Inside the chamber is provided with a sample holder on which samples may be placed as well as a plasma source against it. The plasma source comprises a pumped vacuum system, the pumped vacuum system can vacuumize the chamber until it reaches the preset base pressure scale; a gas supply system, the gas supply system can fill the chamber with required gas and adjust the gas parameters following some control rules, such as gas flow, pumping speed, gas composition proportion and concentration so on, after the gas is filled into the chamber, the chamber's pressure enters the preset operating pressure scale; and a plasma source, the plasma source can be a radio-frequency, microwave or DC power supply, all which may supply power by pulse mode and be of either fixed or variable frequency.

Optionally, the black silicon fabrication apparatus may also include a power supply applying bias voltage which is electrical connected to the sample holder in the chamber. The type of the power supply applying bias voltage is similar to the plasma power supply, it can be either radio-frequency, microwave or DC power supply, and supplies power in the pulse mode, or can be any combination of such power supplies, so as to supply the sample holder with a bias voltage comprising multiple kinds of bias voltages.

Optionally, the black silicon fabrication apparatus may also comprise monitoring components used for monitoring various processing conditions in the chamber, such as electronic temperature, plasma density, plasma potential, plasma mass spectrum distribution and emission spectrum so on. The power of both plasma power supply and that applying bias voltage can be adjusted according to certain control rules. If they supply power by pulse mode, then the duty ratio, pulse width and the frequency of both plasma power supply and that applying bias voltage can also be adjusted according to certain control rules. The bias voltage applied by the power supply applying bias voltage may be adjusted according to certain control rules.

Figure 2:
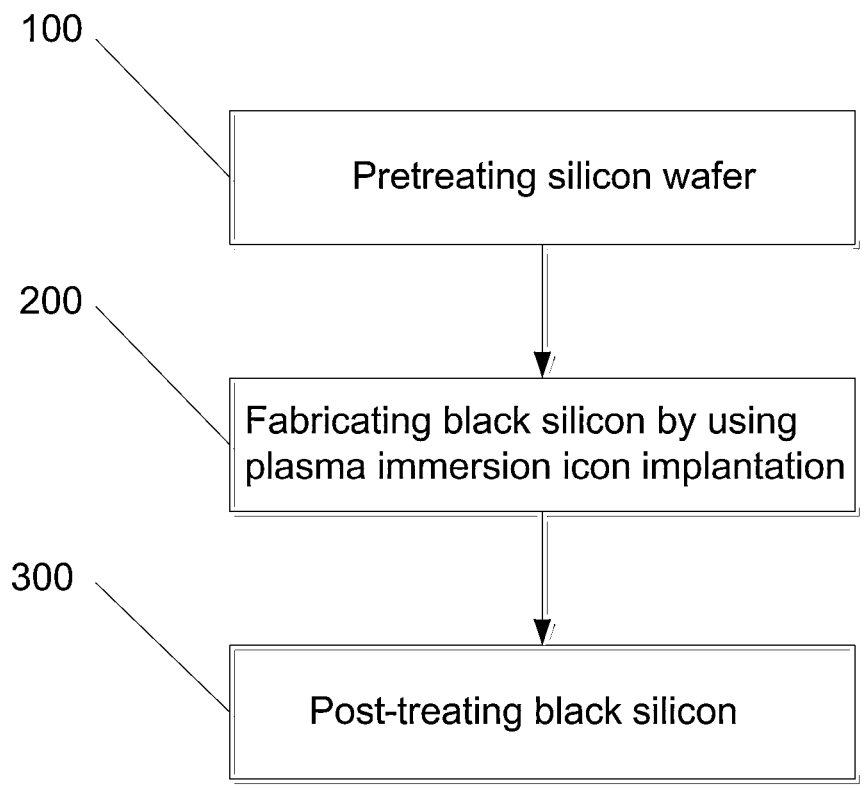
FIG. 2 is a schematic diagram of embodiment of a processing process of the present invention.
Figure 3:
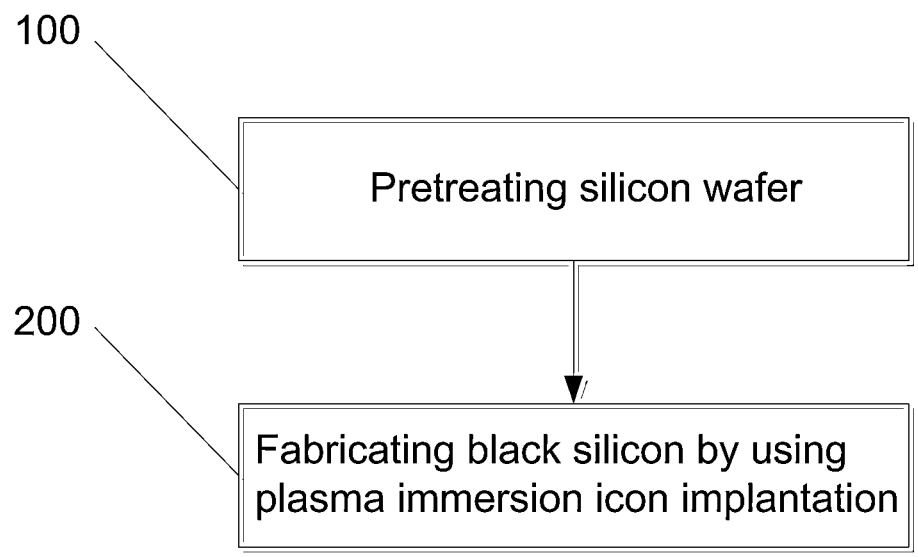
FIG. 3 is a schematic diagram of embodiment of a second processing process of the present invention.
Figure 4:
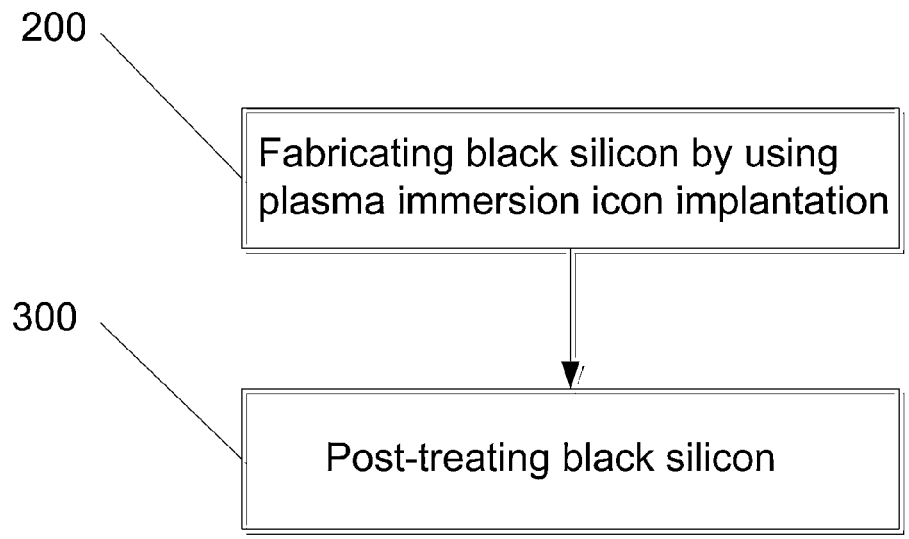
FIG. 4 is a schematic diagram of a third processing process of the present invention.

As shown in FIGS. 2, 3 and 4, aside from the plasma immersion ion implantation technology used to directly fabricate black silicon, the present invention may also employ other auxiliary technologies for black silicon fabrication. For example, silicon wafers may be pretreated (step 100) before black silicon fabrication using plasma immersion ion implantation (step 200). After black silicon fabrication using plasma immersion ion implantation (step 200), the ready-made black silicon may be post-treated (step 300). Such treatments may be chosen as needed. In FIG. 2, both pretreatment and post-treatment of the silicon wafer are used; in FIG. 3, only pretreatment of the silicon wafer is used; in FIG. 4, only post-treatment of the silicon wafer is used. Wherein, silicon wafer pretreatment may comprise such procedures as cleaning, polishing, doping, annealing, corrosion, etching (also known as acid-based printmaking) and/or visualization so on. Black silicon post-treatment may comprise such procedures as cleaning, polishing, doping, annealing, corrosion, etching (also known as acid-based printmaking) and/or visualization so on.

Figure 5:
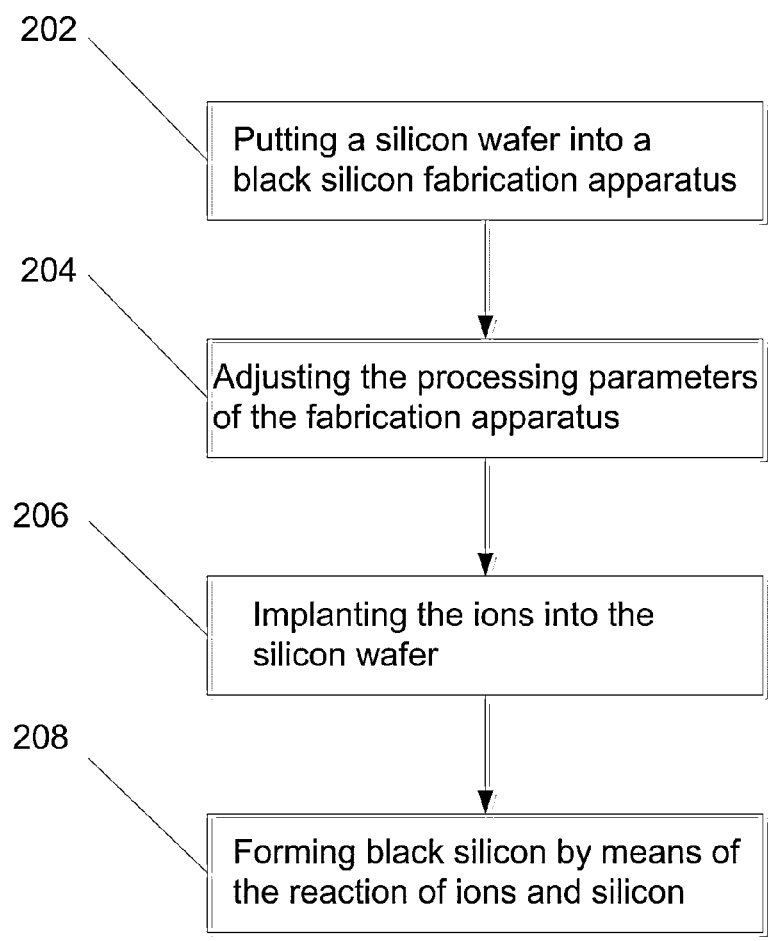
FIG. 5 is a process schematic diagram of fabricating black silicon by using plasma immersion ion implantation of the present invention.

FIG. 5 is a process schematic diagram of fabricating black silicon by using plasma immersion ion implantation of the present invention. In FIG. 5, the whole process comprises the following steps:

Step 202: Putting a silicon wafer into a black silicon fabrication apparatus; said wafer may have undergone such pretreatment procedures as cleaning, polishing, doping, annealing, corrosion, etching (also known as acid-based printmaking) and/or visualization, and may be conventional shape such as round, square or rectangular so on, or of any complex shape; the black silicon fabrication apparatus may be a plasma immersion ion implanter in which the silicon wafer is placed on the sample holder in the chamber; In some embodiments, the black silicon fabrication apparatus may include a power supply applying bias voltage when the silicon wafer may be electrical connected to the sample holder. As the sample holder is electrical connected to the power supply applying bias voltage, the silicon wafer is electrical connected to this power supply; Under some condition, the power supply applying bias voltage is activated to apply bias voltage to the silicon wafer.

Step 204: Adjusting the processing parameters of the black silicon fabrication apparatus in order to enable it to gain the operating conditions for generating plasmas; such processing parameters may include the base pressure and operating pressure implanted into the chamber, flow of implanted gas, gas pumping speed, components and compositional ratio and concentration of mixed gas, output power and frequency of plasma power supply, and bias voltage applied by power supply capable of applying bias voltage. In case of pulse mode, such parameters also include pulse width, duty ratio and frequency. These processing parameters can be preset according to the size of silicon wafer to be processed and fabricated black silicon performance, and modified on site as needed during the processing; During the processing, such processing parameters are monitored, and according to some rules, adjust the parts of the black silicon fabrication apparatus so as to enable the parameters to meet the numerical or preset numerical scale required for the processing;

The base pressure scale implanted into the chamber can be $10^{-7}$ Pa to 1000 Pa, preferably $10^{-5}$ Pa to 10 Pa, more preferably $10^{-5}$ Pa to $10^{-3}$ Pa; The operating pressure scale implanted into the chamber can be $10^{-3}$ Pa to 1000 Pa, preferably 0.01 Pa to 100 Pa, more preferably 0.1 Pa to 50 Pa;

The implantation gas can be a mixture of the gas having an etching effect and the gas having a passivation effect. The gas having an etching effect r includes $SF_6$, $CF_4$, $CHF_3$, $C_4F_8$, $NF_3$, $SiF_4$, $C_2F_6$, HF, $BF_3$, $PF_3$, $Cl_2$, HCl, $SiH_2Cl_2$, $SiCl_4$, $BCl_3$ or HBr; The gas having a passivation effect includes $O_2$, $N_2O$ or $N_2$. Preferably, the implantation gas may be a mixture of several gases having an etching effect and several gases having a passivation effect; more preferably, it is a mixture of a gas having an etching effect and a gas having a passivation effect, such as $SF_6$ and $O_2$, or $CF_4$ and $N_2$. As long as the implantation gas is a mixture of gas having an etching effect and gas having a passivation effect mixed at a volume ratio of 0.01 to 100, these gases can be freely mixed; such volume ratio among the two kinds of gases can be preferably 0.1 to 80, more preferably 1 to 20; the flow of mixed gas can be 1 to 1000 sccm, preferably 10 to 100 sccm, more preferably 20 to 80 sccm;

The output power of plasma power supply is 1 to 100000 W, preferably 10 to 50000 W, more preferably 300~5000 W; the applied bias voltage is −100000 to 100000V, preferably −50000 to 50000V, more preferably −10000 to 0V; the pulse width is 1 us to 1 s, preferably 1 us to 0.1 s, more preferably 1 us to 1 ms; the duty ratio is 1% to 99%, preferably 10% to 90%, more preferably 20% to 80%; the frequency of plasma power supply is DC to 10 GHz, preferably 1 MHz to 5 GHz, more preferably 13.56 MHz to 5 GHz; the frequency of power supply capable of applying bias voltage is DC to 10 GHz;

Step 206: After plasmas are generated and the silicon wafer is immersed, as the silicon wafer is affected by the bias voltage applied and under the accelerating action of the sheath electrical field formed between the silicon wafer and the plasmas, the reactive ions located within the sheath electrical field and those entering through the plasmas are directly implanted into the silicon wafer;

Step 208: The reactive ions react with the silicon wafer, for example, the implantation gas which comprises $SF_6$ and $O_2$ is ionized so that $SF_6$ and $O_2$ respectively produce F* groups and O* groups; wherein the F* groups combine with Si to form $SiF_4$ which produces an etching effect on Si; meanwhile, the O* groups form $Si_xO_yF_z$ on the etching wall surface which passivates the etching wall; consequently, under both etching and passivation actions, the black silicon with a porous or mesh structure eventually is formed.

Figure 6:
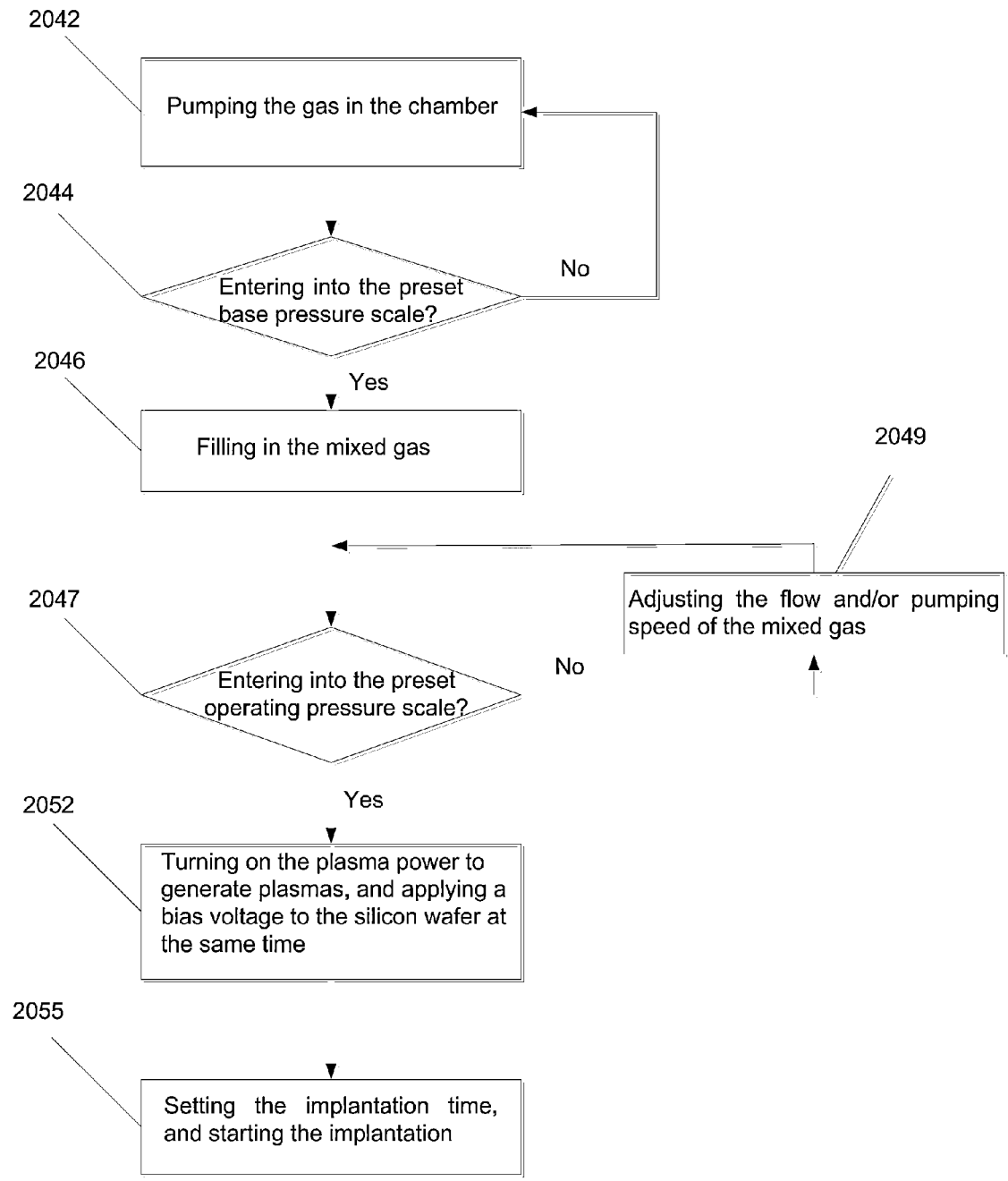
FIG. 6 is a flow schematic diagram of the first embodiment of adjusting implantation technology parameter in FIG. 5.
Figure 7:
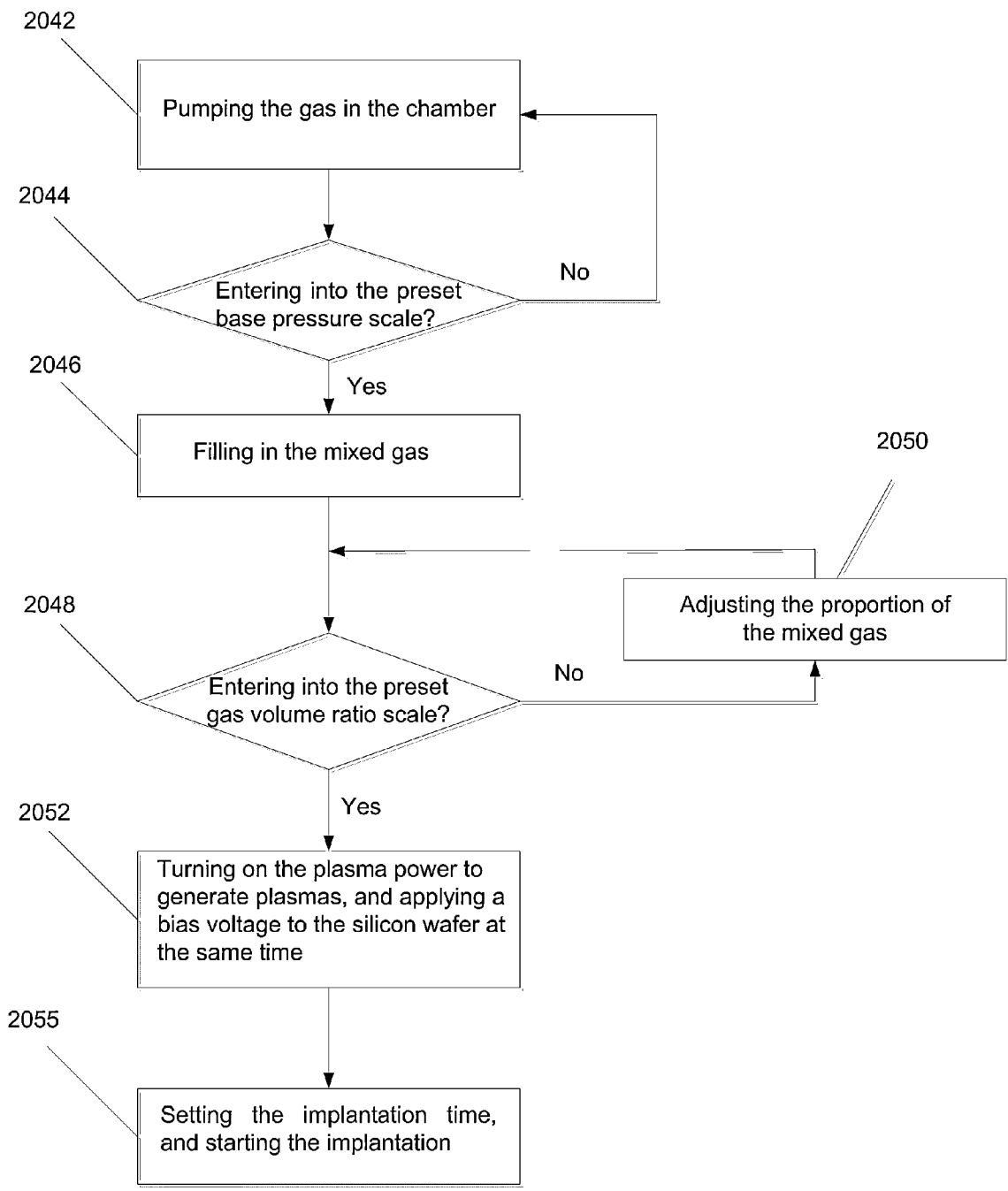
FIG. 7 is a flow schematic diagram of the second embodiment of adjusting implantation technology parameter in FIG. 5.
Figure 8:
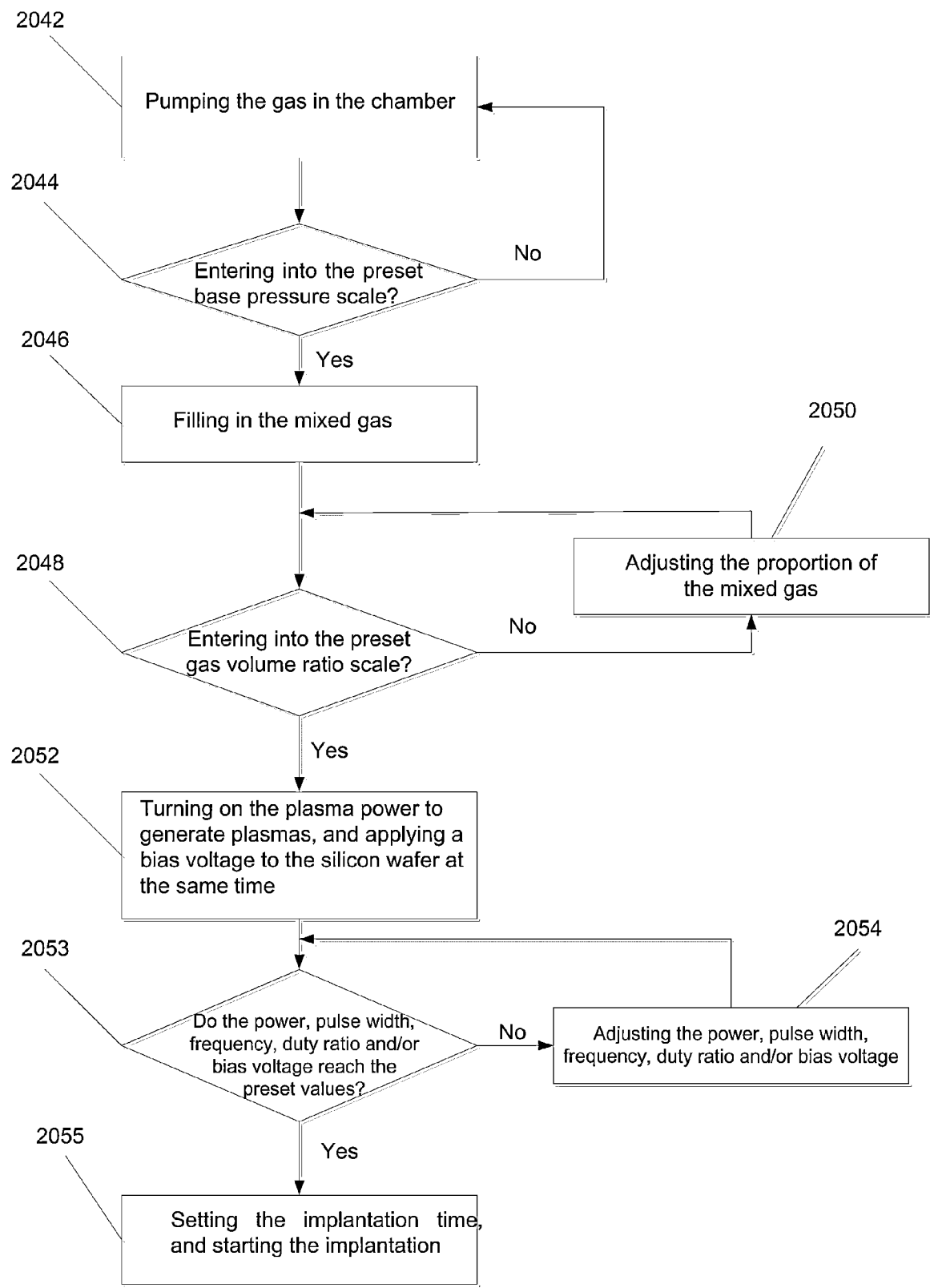
FIG. 8 is a flow schematic diagram of the third embodiment of adjusting implantation technology parameter in FIG. 5.

Within the method for fabricating black silicon by using plasma immersion ion implantation of the present invention, it is a very important step to adjust the processing parameters of black silicon fabrication apparatus. FIGS. 6, 7 and 8 respectively and exemplarily show some substeps to finish said step. Such substeps can be replaceable, combined or cancelled, for example, when adjusting the compositional ratio, flow and pumping speed of mixed gas, man can adjust them all simultaneously, or one or two of them of your choice, or not adjust the processing parameters of the mixed gas. Therefore, for simplicity, no combinations of substeps of adjusting the processing parameters of black silicon fabrication apparatus for generation of plasmas are enumerated herein. It should be noted that same mark number indicates similar operations in both the present invention and attached figures.

As shown in FIG. 6, the first embodiment of adjusting the processing parameters of black silicon fabrication apparatus comprises the following steps:

Step 2042: The pumped vacuum system of plasma source pumps the gas in the chamber;

Step 2044: The monitoring device in the pumped vacuum system determines whether the pressure implanted into the chamber enters the preset base pressure scale, such as $10^{-5}$ Pa to $10^{-3}$ Pa; if it is yes, then go to step 2046, else return to step 2042;

Step 2046: The chamber is filled with mixed gas, such as a mixture of $SF_6$ and $O_2$;

Step 2047: The monitoring device in the pumped vacuum system determines whether the pressure implanted into the chamber enters the preset operating pressure scale, such as 0.1 Pa to 50 Pa; if it is yes, then go to step 2052, else go to step 2049;

Step 2049: The gas feeder in the gas supply system adjusts the flow of mixed gas and/or the speed of pumping the gas in the chamber, for example by adjusting flowmeter or the valve of gas pump or pipeline, return to step 2047;

Step 2052: The plasma power supply is activated to generate the plasmas with a certain density and electronic temperature; meanwhile, the power supply capable of applying bias voltage applies the bias voltage to the silicon wafer placed on the sample holder; the plasma power supply can be a radiofrequency power supply with a frequency of 13.56 MHz and an output frequency of 800 W; the power supply applying bias voltage can be a pulse direct current power supply with a pulse width of 10 us, a duty ratio of 20% and a frequency of 20 kHz, which can apply a bias voltage of −20000V;

Step 2055: The implantation time is set before the beginning of implantation, and start to implantation; the implantation time can be set according to actual situation, such as required performance of fabricating black silicon, silicon wafer shape and size, plasma density and other processing parameters, which all may influence the implantation time more or less.

As shown in FIG. 7, the second embodiment of adjusting the processing parameters of black silicon fabrication apparatus comprises the following steps:

Step 2042: The pumped vacuum system of plasma source pumps the gas in the chamber;

Step 2044: The monitoring device in the pumped vacuum system determines whether the pressure implanted into the chamber enters the preset base pressure scale, such as 10 Pa to 1000 Pa; if it is yes, then go to step 2046, else return to step 2042;

Step 2046: The chamber is filled with mixed gas such as a mixture of $CF_4$ and $N_2$;

Step 2048: The monitoring device in the pumped vacuum system determines whether the volume ratio between the gas having an etching effect and the gas having a passivation effect, both comprising the mixed gas, enters the preset volume ratio scale, for example, whether the volume ratio between $CF_4$ and $N_2$ ranges from 0.1 to 10; if it is yes, then go to step 2052, else go to step 2050;

Step 2050: The gas feeder in the gas supply system adjusts the mixing ratio of mixed gas, return to step 2048;

Step 2052: The plasma power supply is activated to generate the plasmas with a certain density and electronic temperature; meanwhile, the power supply capable of applying bias voltage applies the bias voltage to the silicon wafer placed on the sample holder; the plasma power supply can be a microwave power supply with a frequency of 2.4 GHz and an output frequency of 1000 W; the power supply applying bias voltage can be a pulse direct current power supply with a pulse width of 25 us, a duty ratio of 50% and a frequency of 20 kHz, which can apply a bias voltage of −2000V;

Step 2055: The implantation time is set before the beginning of implantation, and start to implantation; the implantation time can be set according to actual situation, such as required performance of fabricating black silicon, silicon wafer shape and size, plasma density and other processing parameters, which all may influence the implantation time more or less.

As shown in FIG. 8, the third embodiment of adjusting the processing parameters of black silicon fabrication apparatus comprises the following steps:

Step 2042: The pumped vacuum system of plasma source pumps the gas in the chamber;

Step 2044: The monitoring device in the pumped vacuum system determines whether the pressure implanted into the chamber enters the preset base pressure scale, such as 1 Pa to 100 Pa; if it is yes, then go to step 2046, else return to step 2042;

Step 2046: The chamber is filled with mixed gas such as a mixture of $SF_6$ and $O_2$;

Step 2048: The monitoring device in the pumped vacuum system determines whether the volume ratio between the gas having an etching effect and the gas having a passivation effect, both comprising the mixed gas, enters the preset volume ratio scale, for example, whether the volume ratio between $SF_6$ and $O_2$ ranges from 0.5 to 20; if it is yes, then go to step 2052, else return to step 2050;

Step 2050: The gas feeder in the gas supply system adjusts the mixing ratio of mixed gas, return to step 2048;

Step 2052: The plasma power supply is activated to generate the plasmas with a certain density and electronic temperature; meanwhile, the power supply capable of applying bias voltage applies the bias voltage to the silicon wafer placed on the sample holder; the plasma power supply can be a radio-frequency power supply with a maximum frequency of 60 MHz and a maximum output power of 3000 W; the power supply applying bias voltage can be a pulse direct current power supply with a minimum pulse width of 100 us, a duty ratio of 25% and a maximum frequency of 2.5 kHz, which can apply a maximum bias voltage of −5000V;

Step 2053: The monitoring device of plasma power supply (such as the one comprising directional coupler and controller) determines whether the output power and/or frequency of plasma power supply enters the preset numerical scale (e.g. 2000 W to 3000 W as output power scale and 10 MHz to 60 MHz as frequency scale); the monitoring device of power supply applying bias voltage determines whether the pulse width, duty ratio, frequency and/or applied bias voltage are within the preset numerical scales (e.g. 100 us to 10 ms as pulse width scale, 25% to 50% as duty ratio scale, 50 Hz to 2.5 kHz as power supply frequency scale, −1000V to −5000V as applied bias voltage scale); if it is yes, then go to step 2055, else go to step 2054;

Step 2054: According to some control rules, adjusting the output power and frequency of corresponding plasma power supply, and the pulse width, duty ratio, frequency and/or bias voltage of power supply applying bias voltage; return to step 2053;

Step 2055: The implantation time is set before the beginning of implantation, and start to implantation; the implantation time can be set according to actual situation, such as required performance of fabricating black silicon, silicon wafer shape and size, plasma density and other processing parameters, which all may influence the implantation time more or less.

It should be noted that non-reactive ions in the plasmas are also implanted into the silicon wafer except that reactive ions in the plasmas are implanted into the silicon wafer in the present invention. The reason is in some cases, the plasmas generated by the black silicon fabrication apparatus include non-reactive ions which are implanted into the silicon wafer in the immersion ion implantation process.

It should be noted that the control rules mentioned herein can be the common feedback control algorithm, PID control algorithm, fuzzy control algorithm, genetic control algorithm, or a professional system designed according to some experience and knowledge; the control scheme can be realized in an electronic-circuit or mechanical way or through a technical solution adapting to reality adjustment. Wherein, the electronic circuit control scheme comprises hardwire circuit logic control (e.g. Circuit comprising discrete components, or that comprising FPGA, CPLD or GAL), microcontrollers control (e.g. single-chip microcomputer, DSP or ARM) and computer control.

It should be noted that the preset numerical scales mentioned herein include their boundary values, for example, the base pressure scale ranges from $10^{-7}$ Pa to 1000 Pa, including the two boundary values $10^{-7}$ Pa and 1000 Pa. During actual processing process, such preset numerical scales can be automatically adjusted by control algorithm according to process needs or manually adjusted by operators. The expression "and/or" herein means both one of two or more options and more than two options; combinations of multiple options are determined according to actual processing conditions.

It should be noted that the step mentioned herein—adjusting the processing parameters of black silicon fabrication apparatus—can be placed after or before the step putting silicon wafers into black silicon fabrication apparatus, and the initial values of processing parameters can be adjusted in advance as needed; in addition, during the generation and implantation of plasmas, corresponding processing parameters can be appropriately adjusted according to processing requirements and needs (manually or automatically) to fabricate black silicon of required or better performance.

Figure 9:
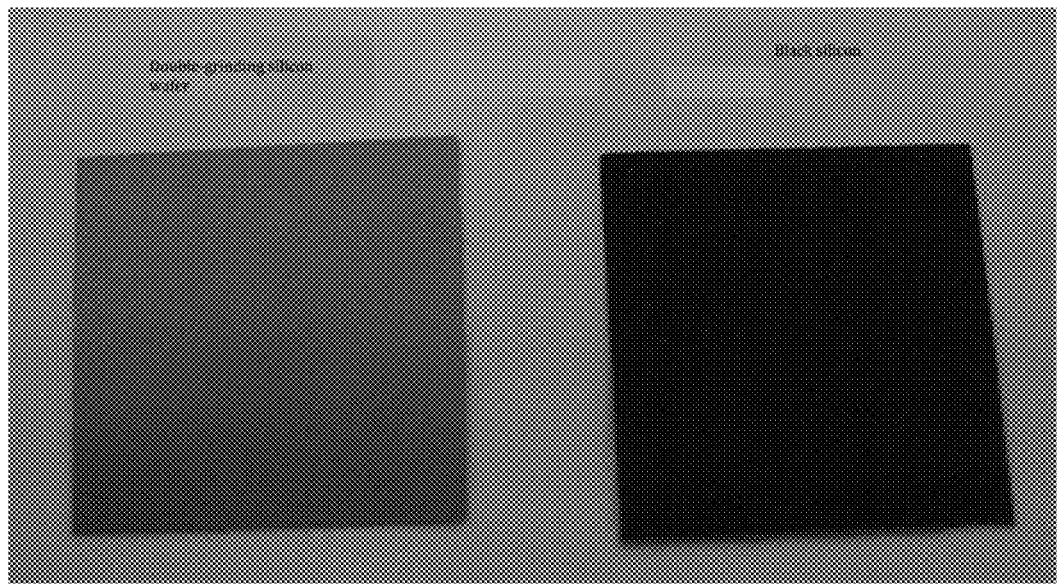
FIG. 9 is a surface features diagram of black silicon fabricated using the present invention.
Figure 10:
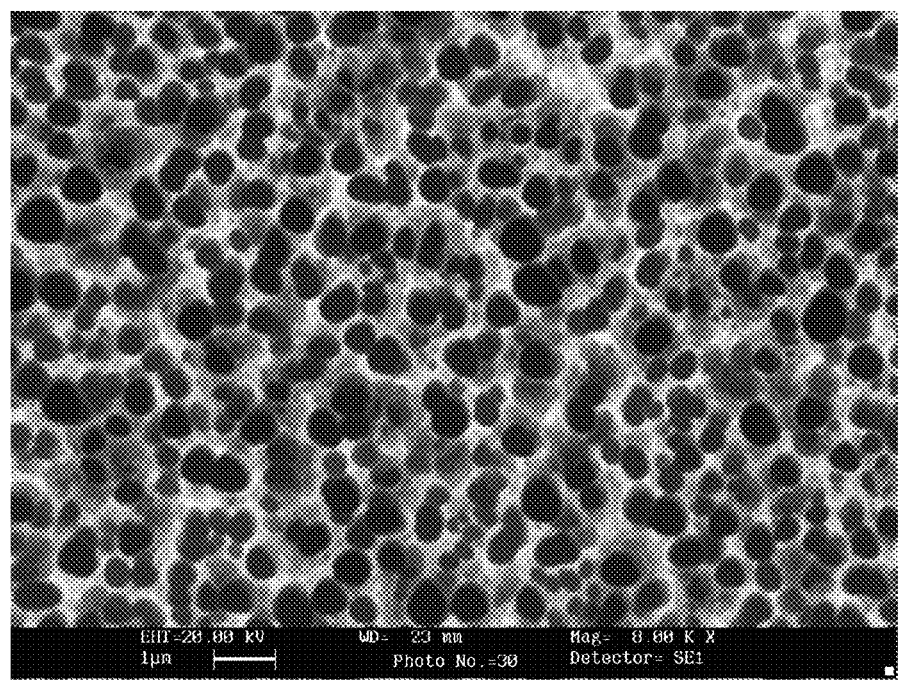
FIG. 10 is a features diagram of black silicon fabricated using the present invention under a scanning electronic microscope.

The black silicon fabricated through the invention is as shown in FIGS. 9 and 10. FIG. 9 is a macroscopic comparison between fabricated black silicon and commercially available polycrystalline silicon wafer, which obviously shows the surface of the black silicon fabricated presents an even black. FIG. 10 is a view of fabricated black silicon under a scanning electronic microscope, which shows that the black silicon surface is a porous structure with a pore diameter of approximately 300 to 500 nm.

Figure 11:
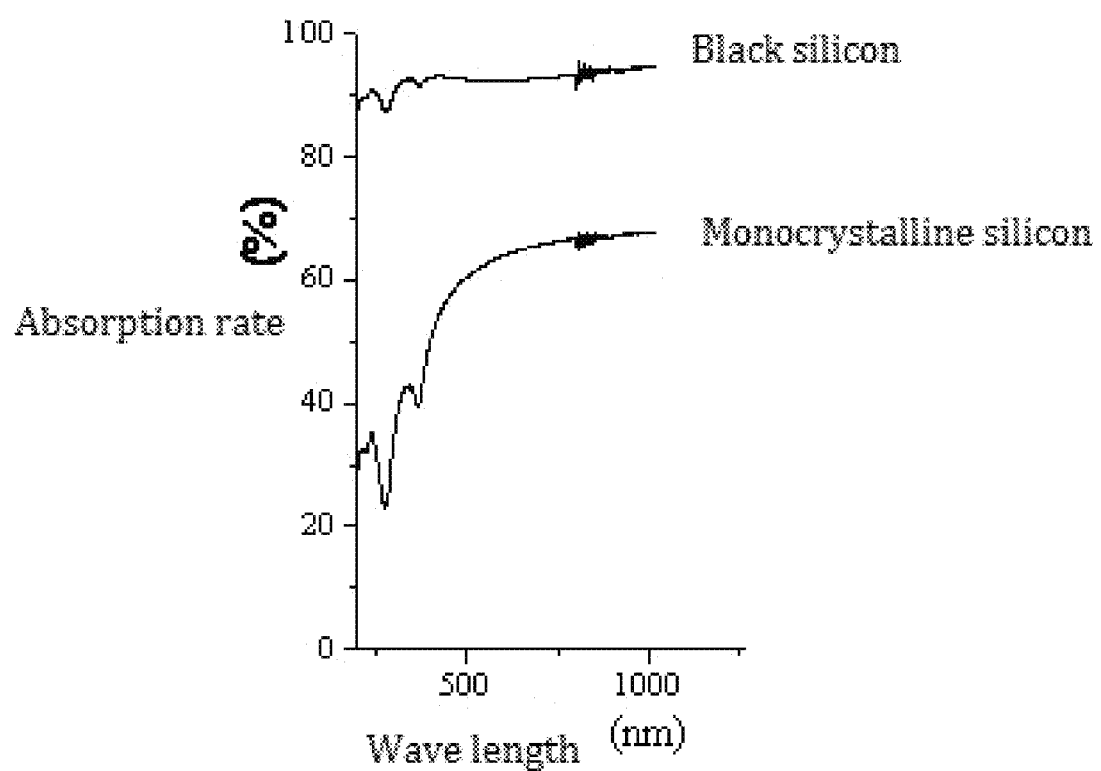
FIG. 11 is a light reflection diagram of black silicon fabricated using the present invention.

FIG. 11 is a comparison schematic diagram of light absorption properties between black silicon fabricated through the present invention and monocrystalline silicon within the visible optical band, which shows that the average light absorption property of monocrystalline silicon is 55% while that of black silicon fabricated through the present invention is as high as 94%. This fact indicates that the black silicon fabricated through the present invention has a much greater visible light absorption property than monocrystalline silicon and so better light absorption characteristics and higher photosensitivity.

The above-mentioned embodiments further describe detailed the purpose, technical scheme and beneficial effects of the present invention. It should be understood that the above-mentioned embodiment is only preferred embodiment of the present invention and shall not be used to limit the present invention. Any improvement, modification, replacement, combination and simplification within the spirit and principle of the present invention shall be considered as equivalent replacement and within the protection scope of the present invention.

What is claimed is:

1. A method for fabricating black silicon by using plasma immersion ion implantation, wherein putting a silicon wafer into a black silicon fabrication apparatus, and using the plasma immersion ion implantation process to fabricate black silicon; wherein
the method comprises:
    (a) putting said silicon wafer into a chamber of said black silicon fabrication apparatus;
    (b) adjusting the processing parameters of said black silicon fabrication apparatus to allow them to enter into preset numerical scales;
    (c) generating plasmas in the chamber of said black silicon fabrication apparatus, the reactive ions among said plasmas are implanted into said silicon wafer; and
    (d) forming black silicon by means of the reaction of said reactive ions and said silicon wafer.

2. The method for fabricating black silicon by using plasma immersion ion implantation of claim 1, wherein said step (a) further comprises said silicon wafer electrical connected to a power supply capable of applying bias voltage.

3. The method for fabricating black silicon by using plasma immersion ion implantation of claim 2, wherein said processing parameters comprise the base pressure and operating pressure implanted into said chamber.

4. The method for fabricating black silicon by using plasma immersion ion implantation of claim 3, wherein said step (b) comprises the following steps:
    pumping the gas in said chamber to make the pressure implanted into said chamber enter into a preset base pressure scale, and said preset base pressure scale ranges from $10^{-7}$ Pa to 1000 Pa; and
    filling into said chamber with the mixed gas which can react with said silicon wafer, and adjusting the flow of said mixed gas to make the pressure implanted into said chamber enter into a preset operating pressure scale, and said preset operating pressure scale ranges from $10^{-3}$ Pa to 1000 Pa.

5. The method for fabricating black silicon by using plasma immersion ion implantation of claim 4, wherein said step (b) comprises the following steps:
    pumping the gas in said chamber to make the pressure implanted into said chamber enter into a preset base pressure scale, and said preset base pressure scale ranges from $10^{-7}$ Pa to 1000 Pa; and
    filling into said chamber with the mixed gas which can react with said silicon wafer, and adjusting the speed of pumping the gas in said chamber by said black silicon fabrication apparatus to make the pressure implanted into said chamber enter into a preset operating pressure scale, and said preset operating pressure scale ranges from $10^{-3}$ Pa to 1000 Pa.

6. The method for fabricating black silicon by using plasma immersion ion implantation of claim 5, wherein said mixed gas consist of the gas having an etching effect and the gas having a passivation effect.

7. The method for fabricating black silicon by using plasma immersion ion implantation of claim 6, wherein said gas having an etching effect includes $SF_6$, $CF_4$, $CHF_3$, $C_4F_8$, $NF_3$, $SiF_4$, $C_2F_6$, HF, $BF_3$, $PF_3$, $Cl_2$, HCl, $SiH_2Cl_2$, $SiCl_4$, $BCl_3$ or HBr, and the gas having a passivation effect includes $O_2$, $N_2O$, or $N_2$.

8. The method for fabricating black silicon by using plasma immersion ion implantation of claim 7, wherein said processing parameters further includes the volume ratio between said gas having an etching effect and said gas having a passivation effect.

9. The method for fabricating black silicon by using plasma immersion ion implantation of claim 8, wherein said the step (b) further comprises the following step:
    adjusting the volume ratio scale between said gas having an etching effect and said gas having a passivation effect in said mixed gas to allow it to enter into a preset volume ratio scale, and said preset volume ratio scale ranges from 0.01 to 100.

10. The method for fabricating black silicon by using plasma immersion ion implantation of claim 9, wherein said processing parameters further include the output power and frequency of the plasma power supply of said black silicon fabrication apparatus as well as the frequency, pulse width and duty ratio of the power supply which can apply a bias voltage, and said bias voltage.

11. The method for fabricating black silicon by using plasma immersion ion implantation of claim 10, wherein said step (b) further comprises the following step: adjusting the output power of said plasma power supply to allow it to enter into a preset output power scale, and said preset output power scale ranges from 1 to 100000 W.

12. The method for fabricating black silicon by using plasma immersion ion implantation of claim 10, wherein said step (b) further comprises the following step:
    adjusting said bias voltage to allow it to enter into a preset bias voltage scale, and said preset bias voltage scale ranges from −100000 to 100000V.

13. The method for fabricating black silicon by using plasma immersion ion implantation of claim 10, wherein said step (b) further comprises the following step:
    adjusting the frequency of said plasma power supply to allow it to enter into a preset frequency scale of the plasma power supply, and said preset frequency scale of the plasma power supply ranges from DC to 10 GHz.

14. The method for fabricating black silicon by using plasma immersion ion implantation of claim 10, wherein said step (b) further comprises the following step:
    adjusting the pulse width of said power supply which can apply a bias voltage to allow it to enter into a preset pulse width scale, and said preset pulse width scale ranges from 1 us to 1 s.

15. The method for fabricating black silicon by using plasma immersion ion implantation of claim 10, wherein said step (b) further comprises the following step:
    adjusting the frequency of said power supply which can apply a bias voltage to allow it to enter into a preset frequency scale of the power supply, and said preset frequency scale of the power supply ranges from DC to 10 GHz.

16. The method for fabricating black silicon by using plasma immersion ion implantation of claim 10, wherein said step (b) further comprises the following step:
adjusting the duty ratio of said power supply which can apply a bias voltage to allow it to enter into a preset duty ratio scale, and said preset duty ratio scale ranges from 1% to 99%.

17. The method for fabricating black silicon by using plasma immersion ion implantation of claim 10, wherein said bias voltage consist of a variety of bias voltages and combination.

18. The method for fabricating black silicon by using plasma immersion ion implantation of claim 5, wherein said mixed gas consist of the gas having an etching effect and the gas having a passivation effect.

19. The method for fabricating black silicon by using plasma immersion ion implantation of claim 18, wherein said gas having an etching effect includes $SF_6$, $CF_4$, $CHF_3$, $C_4F_8$, $NF_3$, $SiF_4$, $C_2F_6$, HF, $BF_3$, $PF_3$, $Cl_2$, HCl, $SiH_2Cl_2$, $SiCl_4$, $BCl_3$ or HBr, and the gas having a passivation effect includes $O_2$, $N_2O$, or $N_2$.

20. The method for fabricating black silicon by using plasma immersion ion implantation of claim 19, wherein said processing parameters further includes the volume ratio between said gas having an etching effect and said gas having a passivation effect.

21. The method for fabricating black silicon by using plasma immersion ion implantation of claim 20, wherein said the step (b) further comprises the following step:
adjusting the volume ratio scale between said gas having an etching effect and said gas having a passivation effect in said mixed gas to allow it to enter into a preset volume ratio scale, and said preset volume ratio scale ranges from 0.01 to 100.

22. The method for fabricating black silicon by using plasma immersion ion implantation of claim 21, wherein said processing parameters further include the output power and frequency of the plasma power supply of said black silicon fabrication apparatus as well as the frequency, pulse width and duty ratio of the power supply which can apply a bias voltage, and said bias voltage.

23. The method for fabricating black silicon by using plasma immersion ion implantation of claim 22, wherein said step (b) further comprises the following step: adjusting the output power of said plasma power supply to allow it to enter into a preset output power scale, and said preset output power scale ranges from 1 to 100000 W.

24. The method for fabricating black silicon by using plasma immersion ion implantation of claim 22, wherein said step (b) further comprises the following step:
adjusting said bias voltage to allow it to enter into a preset bias voltage scale, and said preset bias voltage scale ranges from −100000 to 100000V.

25. The method for fabricating black silicon by using plasma immersion ion implantation of claim 22, wherein said step (b) further comprises the following step:
adjusting the frequency of said plasma power supply to allow it to enter into a preset frequency scale of the plasma power supply, and said preset frequency scale of the plasma power supply ranges from DC to 10 GHz.

26. The method for fabricating black silicon by using plasma immersion ion implantation of claim 22, wherein said step (b) further comprises the following step:
adjusting the pulse width of said power supply which can apply a bias voltage to allow it to enter into a preset pulse width scale, and said preset pulse width scale ranges from 1 us to 1 s.

27. The method for fabricating black silicon by using plasma immersion ion implantation of claim 22, wherein said step (b) further comprises the following step:
adjusting the frequency of said power supply which can apply a bias voltage to allow it to enter into a preset frequency scale of the power supply, and said preset frequency scale of the power supply ranges from DC to 10 GHz.

28. The method for fabricating black silicon by using plasma immersion ion implantation of claim 22, wherein said step (b) further comprises the following step:
adjusting the duty ratio of said power supply which can apply a bias voltage to allow it to enter into a preset duty ratio scale, and said preset duty ratio scale ranges from 1% to 99%.

29. The method for fabricating black silicon by using plasma immersion ion implantation of claim 22, wherein said bias voltage consist of a variety of bias voltages and combination.

30. A method for fabricating black silicon by using plasma immersion ion implantation, wherein putting a silicon wafer into a black silicon fabrication apparatus, and using the plasma immersion ion implantation process to fabricate black silicon, wherein the method further comprises the pretreatment process of said silicon wafer before fabricating black silicon by using plasma immersion ion implantation, said pretreatment process includes such procedures as cleaning, polishing, doping, annealing, corrosion, etching or visualization.

31. A method for fabricating black silicon by using plasma immersion ion implantation, wherein putting a silicon wafer into a black silicon fabrication apparatus, and using the plasma immersion ion implantation process to fabricate black silicon, wherein the method further comprises the post-treatment process of said black silicon after fabricating black silicon by using plasma immersion ion implantation, said post-treatment process includes such procedures as cleaning, polishing, doping, annealing, corrosion, etching or visualization.

* * * * *